United States Patent
Rebeyrotte et al.

(10) Patent No.: US 9,681,585 B2
(45) Date of Patent: Jun. 13, 2017

(54) METHOD FOR DISTRIBUTION OF COOLING AIR FOR ELECTRICAL EQUIPMENT INSTALLED IN AN AVIONIC BAY AND AIRCRAFT EQUIPPED WITH SUCH A BAY

(75) Inventors: Vincent Rebeyrotte, Colomiers (FR); Jean-Christophe Caron, Leguevin (FR)

(73) Assignee: AIRBUS OPERATIONS (SAS), Toulouse (FR)

( * ) Notice: Subject to any disclaimer, the term of this patent is extended or adjusted under 35 U.S.C. 154(b) by 694 days.

(21) Appl. No.: 13/469,575

(22) Filed: May 11, 2012

(65) Prior Publication Data
US 2012/0285665 A1    Nov. 15, 2012

(30) Foreign Application Priority Data
May 13, 2011  (FR) ...................................... 11 01467

(51) Int. Cl.
| | | |
|---|---|---|
| F28D 15/00 | (2006.01) | |
| H05K 7/20 | (2006.01) | |
| H05K 7/14 | (2006.01) | |

(52) U.S. Cl.
CPC ....... H05K 7/20563 (2013.01); H05K 7/1412 (2013.01)

(58) Field of Classification Search
CPC .. H05K 7/20; H05K 7/20145; H05K 7/20181; H05K 7/20563; H05K 7/1412; F28F 19/01
USPC .................................. 165/119; 361/690–697
See application file for complete search history.

(56) References Cited

U.S. PATENT DOCUMENTS

| | | | | |
|---|---|---|---|---|
| 5,253,484 A * | 10/1993 | Corman et al. | ................... | 62/239 |
| 5,361,188 A * | 11/1994 | Kondou | ................ | H01L 23/467 |
| | | | | 165/104.34 |
| 5,464,461 A * | 11/1995 | Whitson et al. | ................ | 55/480 |
| 5,725,622 A * | 3/1998 | Whitson et al. | .............. | 55/385.4 |
| 6,226,182 B1 * | 5/2001 | Maehara | ............ | H05K 7/20127 |
| | | | | 165/121 |
| 2004/0050569 A1* | 3/2004 | Leyda | ................ | H05K 7/20563 |
| | | | | 174/50 |
| 2005/0152116 A1 | 7/2005 | McClary | | |

(Continued)

FOREIGN PATENT DOCUMENTS

| | | | | |
|---|---|---|---|---|
| CA | 2538670 A1 * | 9/2006 | ......... | H05K 7/20563 |
| FR | 2 560 476 | 8/1985 | | |

OTHER PUBLICATIONS

French Preliminary Search Report issued Nov. 7, 2011, in French 1101467, filed May 13, 2011 (with English Translation of Categories of Cited Documents).

Primary Examiner — Len Tran
Assistant Examiner — Gordon Jones
(74) Attorney, Agent, or Firm — Oblon, McClelland, Maier & Neustadt, L.L.P.

(57) ABSTRACT

A method for distribution of cooling air for cooling an electrical equipment item installed in an avionic bay. Cooling air is drawn from an air vein, then passes into a first pressure zone in fluidic communication with the air vein and then into a second pressure zone in fluidic communication with both the first pressure zone and the electrical equipment. The second pressure zone extends beneath a largest dimension (e.g., length) of electronic boards of the electrical equipment to be cooled.

19 Claims, 5 Drawing Sheets

(56) References Cited

U.S. PATENT DOCUMENTS

| | | | |
|---|---|---|---|
| 2006/0005555 A1* | 1/2006 | Alappat | H05K 7/20563 257/369 |
| 2006/0034051 A1* | 2/2006 | Wang et al. | 361/696 |
| 2006/0215363 A1* | 9/2006 | Shipley | H05K 7/20563 361/695 |
| 2010/0008025 A1 | 1/2010 | Nemoz et al. | |
| 2010/0302727 A1* | 12/2010 | Bellin et al. | 361/679.49 |
| 2012/0227930 A1* | 9/2012 | Rowe | H05K 7/20145 165/11.1 |

* cited by examiner

METHOD FOR DISTRIBUTION OF COOLING AIR FOR ELECTRICAL EQUIPMENT INSTALLED IN AN AVIONIC BAY AND AIRCRAFT EQUIPPED WITH SUCH A BAY

CLAIM FOR PRIORITIES

FR Application No. 11 01467 of May 13,2011

This invention relates to a method and a device for distribution of cooling air for aircraft electrical equipment which in particular is installed in an avionic bay. It also relates to a bay able to accommodate electrical equipment items and an aircraft equipped with such a bay.

There are known in the state of the art electrical equipment items made up of several electronic boards, generally printed circuits on which heat-dissipating electronic components are installed and soldered. Furthermore, electrical connectors are disposed at least on the edges of the boards and the electronic boards as a whole are inserted into a metal housing or packaging. The housing or packaging consists mainly of a base and a cover. The electrical equipment set up in this way is intended to be installed on a rack of an avionic bay. Avionic bays are disposed in a pressurized zone of the aircraft, under a partially controlled ambient temperature. These avionic bays provide the electrical equipment items with preferential ventilation conditions thus allowing cooling thereof.

In order to integrate the electrical equipment items into the avionic bay, there is used, for example, a technique described in the document U.S. Pat. No. 5,253,484. An avionic bay comprises several racks and each rack integrates a ventilation vein. On each rack, and for each electrical equipment item intended for same, there is installed a mechanical and electrical interface, called tray, which performs several functions.

Among these functions, the tray provides aeraulic control of the part of the rack above the ventilation vein in which the ventilation air allotted to the electrical equipment items circulates. The cooling air intended for an electrical equipment item is drawn by the tray from the cooling air vein of the rack of the bay. The cooling air is used to draw off thermal power dissipated by the electronic components of the boards of the associated electrical equipment. This dissipated thermal power is evacuated through convection by virtue of the cooling air that goes through the spaces between the boards before leaving the equipment via holes provided through the housing of the electrical equipment, then being drawn out of the avionic bay via an extraction shaft situated above electrical equipment 2.

Such an arrangement is defined in particular in an international aeronautical standard ARINC600 and an exemplary implementation is described in the document US-A 20040050569.

A schematic side view in cross section and a partial view in perspective of an electrical equipment item installed on a tray of a rack have been shown respectively on FIGS. 1a and 1b.

Rack 1 comprises mainly a bent metal section taking on the shape of a channel bordered by two vertical edges and two side (horizontal) wings intended to bear electrical equipment items such as equipment 2 later on.

A tray 9, serving as mechanical and electrical interface, shown in perspective on FIG. 1b, is positioned on the side wings of rack 1. Tray 9 has a vertical part 6, forming a back, connected by an angle bracket 6a and an angle bracket 6b to a horizontal part 7 (FIG. 1b) forming a seat.

The tray is fastened, for example by screws, onto the side wings of rack 1 and is constructed so as to accommodate an electrical equipment item 2. The electrical equipment comprises mainly a housing formed by a metal cover which is closed off at the bottom part by a base bearing a slider support. On each of the sliders of the slider support, a removable electronic board such as board 10 on FIG. 1a is inserted.

Electronic board 10 comprises a printed circuit on which there are installed a multitude of electronic components arranged in rows 11A, 11B and 11C. A connector 4 makes it possible to connect all the electronic boards of the equipment with an avionic connector not shown on FIG. 1a. The connection is implemented during installation of electrical equipment 2 on tray 9, and during its insertion into an avionic connector 8 (FIG. 1b) which is connected to the electrical network of the airplane.

As shown on FIG. 1b, seat 7 of tray 9 has, above the channel formed in rack 1 and serving as housing for circulation of a cooling air vein 14, a hollow part 12 which is provided with a plurality of holes such as hole 13. This part constitutes a zone for passage of the air between the ventilation vein and the electrical equipment.

As is known in the state of the art and according to the power dissipated by the electrical equipment, certain holes 13 of seat 7 may be blocked and others may be open so that the pressure drop between air vein 14 and the flow of cooling air injected into the equipment may be controlled.

For this purpose, the bottom part of electrical equipment 2 is provided with slots along the inter-slider spaces. It results from this arrangement that the cold air is drawn from vein 14 and circulates vertically on FIG. 1a along the electronic components of the boards that produce heat during their operation. The top part 15 of the housing for the electrical equipment likewise is provided with holes to allow evacuation of the cooling air after its passage over the components to be cooled.

The inventors became aware that such an arrangement brings about a space section part 16 situated to the right of a space section 15 on FIG. 1a which, in the housing of electrical equipment 2, is not covered by the cooling air. The result is that the electronic board, such as board 10, must be designed so that the zone of this board that is in space section 16 of the electrical equipment does not comprise electronic components critical from the thermal point of view. This presents a drawback since it involves an additional constraint for design of the electronic board.

Furthermore, each manufacturer of electrical equipment items such as electrical equipment 2 on FIG. 1a is allotted by the designer of the airplane a cooling air flow proportional to the dissipated power so that the cooling may take into account the thermal dissipation of the electronic casings. The ventilation system of the airplane then maintains a constant pressure in rack 1 of the electronic bay and each parts manufacturer is to guarantee that, under the rated flow that is allotted thereto, the pressure drop generated both by the mechanical and electrical interface tray and by the housing for the actual electrical equipment is:

250 Pa (+50/−50 Pa); or

250 Pa (0/+50 Pa) in constraints more restrictive than the ARINC600 standard.

In the state of the art, so as to avoid having too many parameters to control in order to determine the pressure drop between vein 14 circulating in the rack and the interior of the electrical equipment to be cooled, the support for the sliders that accommodate the printed boards has extensive cut-outs between these sliders and therefore adds hardly any pressure drop. Nevertheless, the seat of the mechanical and electrical interface tray may be adapted so as to distribute the air extracted between the sliders and the boards installed inside the electrical equipment item. Such a situation has been shown schematically in cross section on FIG. 2. On FIG. 2, the same elements as those of FIGS. 1a and 1b bear the same reference numbers.

FIG. 2 shows a rack 1 on which an interface tray 9 composed essentially of a vertical part or back 6 and a bottom part or seat 7 is installed.

According to the geometry of the rack on the one hand, and the geometry of the electrical equipment on the other hand, the aperture zone 12 is limited in particular by an aeraulic staunch joint 17. Above joint 17 there is disposed base 18, the bottom part of the housing for electrical equipment 2 inserted onto tray 9. Base 18 bears a slider support 19 on the upper face of which a board slider 19' has been shown. A board slider 19' consists of a U-shaped section along which a longitudinal edge of the board not shown on FIG. 2 is disposed. Finally, a closing cover 20 for the electrical equipment is shown in part. Between each slider 19' a slot is implemented which makes it possible not to introduce any additional pressure drop at the lower part of the board. Air is drawn, however, from gaseous vein 14 through aperture zone 12 with a controlled pressure drop and passes into sole cooling zone 15. It is noted that the cooling air cannot go through offset zone 16 which is offset laterally in relation to zone 15 (zone 16 is not, like zone 15, above aperture zone 12). Zone 16 therefore is unventilated.

The limitation of the ventilation zone to zone 15 penalizes the thermal management of electrical equipment items the front and side zones of which are not directly ventilated. The effect of that is:
- a lack of flexibility as to placement of the components in the poorly ventilated regions thereof, which is a major constraint on the architecture of the equipment items as well as during placement and routing of the components on the boards;
- this arrangement possibly entails an excessive demand for air in order to compensate for the lack of cooling in certain zones of the equipment.

On FIG. 2, the apertures of aperture zone 12 allow an aeraulic communication between air vein 14 and cooling zone 15 that goes through slot 21 disposed between each inter-slider space in slider support 19. Since electrical equipment 2 is fully included in cover 20 integral with base 18, it is noted that the cooling flow is not conveyed to unventilated zone 16 (to the right on FIG. 2) which constitutes the front zone of the electrical equipment when it is installed in the bay.

In order to remedy at least one of the drawbacks of the state of the art, this invention relates to a method for distribution of cooling air for heat-dissipating aircraft electrical equipment, the method using a cooling air vein to cool at least one heat-dissipating aircraft electrical equipment item, the said at least one electrical equipment item to be cooled being disposed above the cooling air vein, characterized in that the method comprises:
- the formation of a first pressure zone in fluidic communication with the cooling air vein;
- the formation of a second pressure zone in fluidic communication with the said first pressure zone, the second pressure zone extending along an extension dimension greater than the extension dimension of the first pressure zone and being in fluidic communication with the interior of the electrical equipment to be cooled.

The arrangement of a second pressure zone more extensive than the first pressure zone and which communicates with the interior of the equipment to be cooled, and particularly electronic boards thereof, makes it possible to cool a larger portion of the equipment than in the state of the art.

In particular, the second pressure zone extending beneath the electronic boards to be cooled, along an extension dimension corresponding more or less to the largest dimension (length) of the electronic boards, makes it possible to distribute the flow of air drawn from the cooling air vein over the entire length of the said boards.

Therefore it no longer is necessary to design electronic boards by positioning heat-dissipating components only in the zones situated at the base of the cooling air vein.

The cooling air distribution method according to the invention therefore is more effective than the methods known to date.

It will be noted that the air distributed to the electronic equipment then is discharged into the ambient air through openings implemented for this purpose.

According to a possible characteristic, the second pressure zone extends at the lower part of the electrical equipment, beneath the electronic boards to be cooled, along an extension dimension that corresponds at least to the largest dimension of the electronic boards.

According to another possible characteristic, dependent on or independent of the preceding one, the cooling air vein extends along a first horizontal direction, cooling air being drawn from the air vein along a second vertical direction, the second pressure zone extending horizontally.

For example, the second pressure zone extends along a third horizontal direction perpendicular to the first direction.

It will be noted that the flow of cooling air drawn from the cooling air vein is distributed by virtue of the two pressure zones arranged vertically one above the other. The air flow distributed in this way along a larger horizontal dimension (along the third horizontal direction along which the second pressure zone extends) is distributed to the electronic boards to be cooled along a vertical axial direction, over the entire length of the electronic boards. In this way the latter are swept by the flow of cooling air from the bottom up along their height (this height is perpendicular to their length).

According to another possible characteristic, formation of the pressure zones comprises a step for determining a pressure drop between the cooling air vein and the first pressure zone, possibly for determining a pressure drop between the first pressure zone and the second pressure zone, and possibly for determining a pressure drop between the second pressure zone and the interior of the electrical equipment to be cooled so as to set a distribution of the cooling air.

In this way a pressure drop is determined at one and/or the other of the levels so as to set a desired air distribution.

It will be noted that a substantial pressure drop at at least one of the levels (for example between the air vein and the first pressure zone and/or between the first zone and the second zone, or even between the second zone and the interior of the equipment) necessitates allowing more air to pass to one and/or the other of these levels.

It will be noted that in the event of loss of forced ventilation (primary ventilated mode) originating from the avionic bay, cooling of the electrical equipment or equipment items by natural convection is always possible (degraded ventilated mode).

According to another possible characteristic, the method also provides for a filtration of the cooling air in order to separate polluting particles from this air, the filtration comprising:

the filtration of at least one part of the air vein by passage, along an axial direction, through a first separation grille between the air vein and the first pressure zone, the filtration of the said at least one part of the air vein filtered beforehand by passage, along the axial direction, through a second separation grille between the first pressure zone and the second pressure zone.

Each separation or filtration grill comprises a series of apertures which go right through the grille (in its thickness) along an axial direction which is taken on by the cooling air in order to pass through the grille concerned.

It will be noted that the grilles are disposed successively one behind the other, for example disposed in parallel.

Furthermore, the diameters of the apertures are not necessarily different from one grille to the other, but of course may vary according to filtration needs and pressure-drop constraints.

The filtration according to the invention thus is particularly simple to use and effective.

In this way, the air drawn from the cooling vein and which is distributed to the electrical equipment or to the electrical equipment items is filtered particularly effectively, which tends to reduce the proportion of dirt and dust inside the equipment or equipment items.

It will be noted that the width (or diameter) of the apertures of the second grille may be less than that of the first grille.

The number of apertures may vary from one grille to the other and, for example, be greater in the second grille, the width of the apertures also being able to vary from one grille to the other as indicated above.

According to a possible characteristic, the method comprises filtration, by passage through a third separation grille, the said at least one part of the air vein filtered beforehand by passage through the second separation grille.

In this way, the filtered air originating from the second separation or filtration grille enters the apertures of the third separation or filtration grille so as to improve the filtration effect.

It will be noted that the third grille extends along a dimension larger than that of the second grille/first grille or, in any case, the zone of the third grille provided with apertures extends along a larger dimension than the aperture zone of the second/first grille.

According to another possible characteristic, the second separation grille comprises apertures which are offset transversely in relation to the respective apertures of the first separation grille and/or the second separation grill through which the air passes along the axial direction.

The fact that the apertures of the second grille are offset transversely in relation to the apertures of the first grille and not opposite each other and/or that the apertures of the third grille are offset transversely in relation to the apertures of the second grille and not opposite each other, forms baffles for the cooling air going through these grilles, which becomes the air flow, thus contributing to the filtration effect.

It will be noted, for example, that the apertures are disposed in offset rows from one grille to the other.

The air circulating through these grilles goes through these grilles axially but its path is deviated sideways between two consecutive grills.

It will be noted that when a third separation or filtration grille is provided, this additional baffle(s) level improves the filtration effect on the cooling air.

It will be noted that the axial direction of passage through the grilles by the cooling air is the direction along which the air, once filtered, passes along the electronic boards (depending on their height) and their components to be cooled.

Furthermore, the transverse offset of the apertures between two consecutive plates or grilles may be adjusted in amplitude according to filtration needs, while taking pressure-drop constraints into account.

According to another aspect, the invention also has as an object a device for distribution of cooling air for heat-dissipating aircraft electrical equipment, characterized in that the device comprises:

means for formation of a first pressure zone in fluidic communication with a cooling air vein disposed beneath the said at least one heat-dissipating electrical equipment item to be cooled, means for formation of a second pressure zone in fluidic communication with the said first pressure zone, the second pressure zone extending along an extension dimension greater than the extension dimension of the first pressure zone and being in fluidic communication with the interior of the electrical equipment to be cooled.

According to other possible characteristics taken individually or in combination:

the second pressure zone extends at the lower part of the electrical equipment, beneath the electronic boards to be cooled, along an extension dimension that corresponds at least to the largest dimension (length) of the electronic boards;

the cooling air vein extends along a first horizontal direction, cooling air being drawn from the air vein along a second vertical direction, the second pressure zone extending horizontally (for example along a third horizontal direction perpendicular to the first direction);

The device comprises means for filtration of at least one part of the cooling air vein by passage, along an axial direction, through a first separation grille between the air vein and the first pressure zone, filtration means for the said at least one part of the air vein filtered beforehand by passage, along the axial direction, through a second separation grille between the first pressure zone and the second pressure zone; such a filtration device is particularly simple in design and proves to be effective in filtration of the air, prior to supplying of this filtered air to an aircraft electrical equipment item;

the device also may comprise means for distribution, at least in part to the aircraft electrical equipment, of the said at least one part of the air vein filtered by the last grille;

the device also may comprise means for filtration, by passage through a third separation grille, of the said at least one part of the air filtered beforehand by passage through the second separation grille; the filtration grilles are disposed in parallel so that passage of the air through each of them takes place along the axial direction;

the second separation grille and/or the third separation grille comprises/comprise apertures which are offset transversely in relation to the respective apertures of the first separation grille and/or the second separation grill through which the air passes from the axial direction; this or these transverse offset(s) form baffles for the cooling air.

According to another aspect, the invention relates to an avionic bay comprising at least one aircraft electrical equipment item and a device for distribution of cooling air intended to cool the said at least one aircraft electrical equipment item.

The device for distribution of air is in accordance with the device briefly explained above and which may comprise the possible additional characteristics mentioned above taken individually or in combination.

According to another aspect, the invention relates to an avionic bay able to accommodate one or more electrical equipment items to be cooled, the said bay using the method for cooling air distribution according to the invention such as briefly explained above.

More particularly, the invention relates to an avionic bay comprising at least one electrical equipment item to be cooled and a cooling air vein disposed underneath, characterized in that it comprises a first pressure zone in fluidic communication with the cooling air vein and a second pressure zone in fluidic communication with the interior of the said at least one electrical equipment item, the second pressure zone being in fluidic communication with the said first pressure zone so as to produce a distribution of the cooling air in the interior of the said at least one electrical equipment item, the second pressure zone extending along an extension dimension greater than the extension dimension of the first pressure zone.

The advantages linked to the avionic bay briefly explained above are the same as those mentioned above relating to the cooling air distribution method according to the invention.

According to a possible characteristic, the second pressure zone extends at the lower part of the electrical equipment, beneath the electronic boards to be cooled, along an extension dimension that corresponds at least to the largest dimension (length) of the electronic boards.

According to another possible characteristic, the second pressure zone is disposed in contact with a given volume of electrical equipment to be cooled which is greater than the volume in contact with the sole first pressure zone.

By virtue of an arrangement of the first and second pressure zones, it thus is possible to cool a greater volume of electrical equipment than in the prior art.

It will be noted that in all of the foregoing, the second pressure zone is, for example, disposed inside the electrical equipment item to be cooled.

According to another possible characteristic, the bay comprises a first separation grille between the cooling air vein and the first pressure zone and a second separation grill between the first pressure zone and the second pressure zone.

According to another possible characteristic, the bay comprises:
a third separation grille between the second pressure zone and the interior of the said at least one electrical equipment item to be cooled,
a rack integrating the cooling air vein, the said at least one electrical equipment item being disposed on the rack.

According to a possible characteristic, the second separation grille and/or the third separation grille comprise(s) apertures that are offset transversely in relation to the respective apertures of the first separation grille and/or the second separation grille through which the air passes along an axial direction.

According to another possible characteristic, the bay comprises an electrical and mechanical adaptation tray and the said at least one electrical equipment item to be cooled is installed on the said tray.

More particularly, the first separation grill may form part of the electrical and mechanical adaptation tray, which simplifies the design of the bay.

According to another possible characteristic, the said at least one electrical equipment item may be installed on the tray through a base of which the second separation grille forms part.

There again, such an arrangement simplifies the design of the bay.

More particularly, the bay comprises:
at least one electrical and mechanical adaptation tray installed on the rack integrating the cooling air vein;
the said at least one removable electrical equipment item integrating a plurality of dissipating electronic boards installed on sliders borne by a slider support, the said slider support being installed on a base positioned on the electrical and mechanical adaptation tray;
the said electrical and mechanical adaptation tray being provided with an aperture zone in a given zone in contact with the air vein, the said aperture zone on the tray forming the first separation grille for the first pressure zone.

According to other possible characteristics taken individually or in combination:
a base of the electrical equipment items bears, in the first pressure zone which is bordered with a peripheral joint around the aperture zone of the tray, a given distribution of apertures and reserves of material forming the second separation grille;
a second peripheral joint is disposed between the base and the aforesaid slider support so as to form the second pressure zone in fluidic communication with at least one part of the said first pressure zone;
inter-slider spaces of the aforementioned slider support are closed off by a surface with given apertures/porosities and/or reserves of material in fluidic communication with the second pressure zone in order to form the third separation grille with the interior of the electrical equipment item to be cooled.

The invention also relates to an electrical equipment item adapted for being installed on an avionic bay according to the invention.

Such an electrical equipment item comprises:
a slider support the inter-slider spaces of which are closed off by a surface with given apertures/porosities and/or reserves of material in order to form the third separation grille between the second pressure zone, in the interior of the electrical equipment, and the electronic boards to be cooled;
a base on which the slider support is positioned and which bears a given distribution of apertures and reserves of material in order to form the second separation grille in fluidic communication between the second pressure zone and the first pressure zone (for example tray and base).

The second pressure zone created between the base and the slider support thus is intended later on, when the electrical equipment is installed in a bay, to come into fluidic communication with the first pressure zone formed in order to ensure a distribution of the cooling air (drawn from an air vein) in the interior of the electrical equipment to be cooled.

The invention also relates to an aircraft, characterized in that it incorporates at least an avionic bay in accordance with the brief explanation above (with or without the possible additional characteristics taken individually or in partial or total combination) and able to accommodate at least one electrical equipment item according to the invention.

Other characteristics and advantages of this invention will be better understood with the aid of the attached description and the Figures on which:

Figure 3:
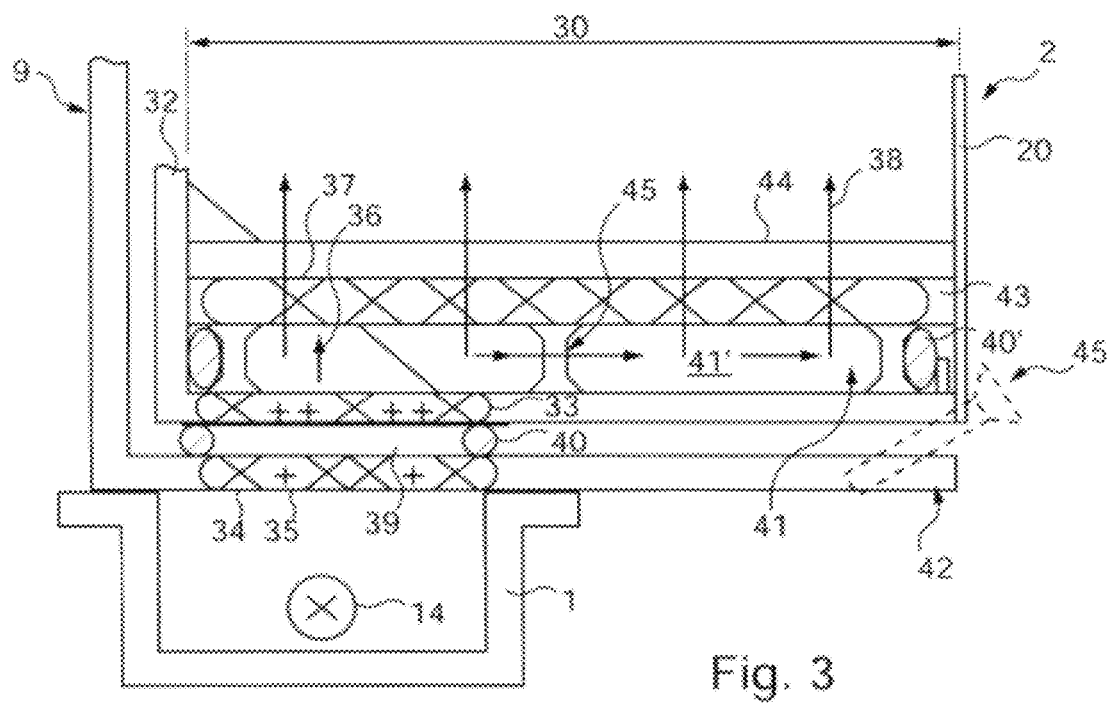
FIG. 3 shows a functional diagram of a device according to the invention.

FIG. 3 shows a cross section of a rack 1 of an avionic bay carried on board an aircraft. As shown, a first pressure zone or chamber 39 is formed and is delimited by a joint 40. This joint is disposed between seat 7 of mechanical and electrical adaptation tray 9 and base 42 of the housing of electrical equipment 2 to be cooled. This first pressure zone or chamber 39 does not continue, to the right of the drawing, to the front zone of electrical equipment 2, but on the contrary remains confined in the left part of the drawing near back 6 of the tray. The arrangement of a second pressure zone allows cooling of the entire volume 30 of the interior of electrical equipment 2.

In this way a second pressure chamber 41 is created between the upper face of base 42 of the electrical equipment and the lower face of slider support 43 by the interposition of a second aeraulic joint 40'. As will be explained in detail below, slider support 43 is equipped with inter-slider zones provided with porosities or apertures 37 the diameter or diameters and the distribution of which are determined according to a predetermined pressure drop. In order to create the second pressure zone, slider support 43 is moved away from the upper face of lower base 42 by crosspieces such as crosspiece 90. During installation of slider support 43 on the upper face of base 42, second joint 40' is squeezed and imperviousness of the second pressure zone thus is ensured. First joint 40 is tightened between seat 7 of tray 9 and the lower face of base 42 during insertion of electrical equipment 2 onto tray 9, by tightening of oblique nuts 45 installed on the right-hand edge of seat 7. In this way imperviousness of the first pressure zone is ensured.

The distribution of cooling air throughout the volume of the electrical equipment may be designed with the aid of a software program. In order to distribute the air, it is thus provided to:

form/create a first pressure zone in fluidic communication with the air vein of the avionic bay;

form/create a second pressure zone in fluidic communication with the said first pressure zone, the second pressure zone being enlarged in relation to the first zone so as to extend along an extension dimension greater than that of the first zone. More particularly, the second zone extends, for example, along the largest dimension of the electronic boards of the electrical equipment (beneath same) and is in fluidic communication with the interior of the electrical equipment to be cooled. The largest dimension of the equipment is that which includes the largest longitudinal dimension or length of the electronic boards.

It will be noted that the first zone extends only over a part of the largest dimension of the equipment and therefore of the length of the boards.

Fluidic communications are determined in particular by the dimensioning of porosities or apertures 34 (zone 17 of the seat) and 35 (zone 19 of base 42) with diameters and distribution different from one zone to the other.

It will be noted, however, that the diameters of apertures 34 and 35 are not necessarily different. Furthermore, the dimensioning and distribution of apertures 37 of slider support 43 determine the fluidic communication between the second zone and the interior of the equipment. It will be noted that the diameters of apertures 37 and 35 are not necessarily different.

The result of the foregoing is that the air coming from cooling air vein 14 goes through, under a pressure drop determined by the porosity of the apertures, first zone 17 of apertures 34 in order to fill first pressure chamber 39 delimited by joint 40. Then air under pressure (36) goes through a second zone 19 of apertures 35, arranged in base 42 of the housing for the equipment, and is delivered throughout the volume of second pressure chamber 41. Finally, the air is distributed (38) to volume 30 to be cooled (boards and components) in electrical equipment 2 through apertures 37 arranged in slider support 43. The preceding arrangement thus makes it possible to deliver/distribute cooling air in the entire zone 30 occupied by the electronic boards in operation.

Figure 4:
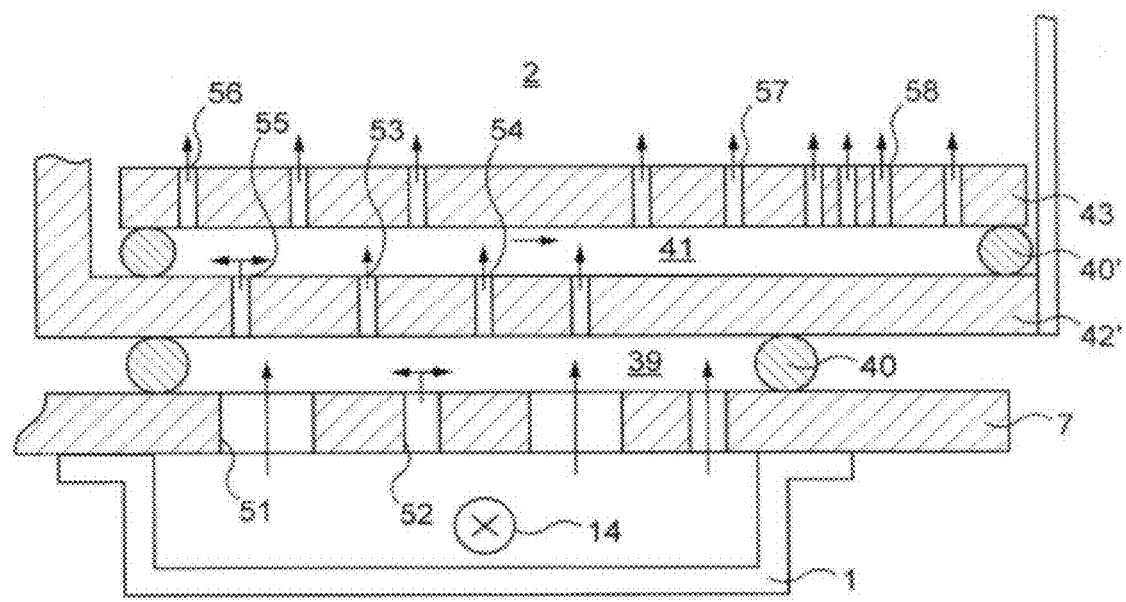
FIG. 4 shows a detail of distribution and filtration of the cooling air in the embodiment of FIG. 3.

The air filtration effect obtained by the various series or successive layers of apertures of the separation or filtration grilles now is going to be described with the aid of FIG. 4.

FIG. 4 illustrates an exemplary air distribution/filtration device according to the invention.

Rack 1 bears seat 7 of the mechanical and electrical adaptation tray which is provided with apertures 51 and constitutes a first separation or filtration grille. The distribution and number of apertures 51 is determined by the pressure drop that is wished to be imposed on gaseous vein 14 in order to pressurize first pressure chamber 39. For this purpose, the arrangement of joint 40 around perforated zones 17 and 19 is noted. Base 42 has a series of apertures 53-55 the axial (vertical) drilling axes of which are offset transversely (horizontally) in relation to the axial drilling axes of at least some apertures 51 of first grille 7. The base provided with apertures 53-55 constitutes a second separation or filtration grille. When the air under pressure goes through apertures 51 from the bottom upward, the offset of the axes of the apertures and the difference between the number of apertures in first grille 7 and in second grille 42 (it will be noted that this difference in number of apertures is optional) make it possible to break up the air jets originating from apertures 51 and to diffuse the air homogeneously to apertures 53-55 of base 42. The offset of apertures between the two grilles leads the air to follow a deviated (winding) and not straight course, forming as it were one or more baffles for the flow of air going through the first grille and getting back to the second grille to go through it. This offset arrangement ensures a protection against possible polluting particles in suspension in the air. Apertures 51 make it possible to distribute the pressure in chamber 39 in order to come to pressurize it. When an air jet originates from an aperture 51, it has a tendency to break up on the lower face of base 42, at a place disposed opposite (axially) the emerging end of aperture 51, a place where the second grille has no apertures (on the contrary, at this place the second grille has a given reserve of material). This offset arrangement makes it possible to have any polluting particles trapped in vein 14 fall down again, which particles otherwise could be introduced into the electrical equipment to be cooled. In this way, a purified and filtered air passes through apertures 53, 54, 55 of second grille 42. The same distribution of offset apertures is applied to the third series of apertures 56-58 which are distributed over the entire surface of slider support 43 (third filtration grille). This offset arrangement introduces a second step of filtration of the cooling air by creating, as between the first and second grilles, a baffle(s) effect.

As shown on FIG. 4, the air going through the apertures of second grille 42 generally follows a more winding course to get back to the apertures of third grille 43 than the air passing from the apertures of the first grille to those of the second grille. This is explained by the fact that the apertures of the third grille are distributed over a far more extensive zone than zone 19 of the second grille. Since the air flow is more markedly deviated, the filtration effect thereof is increased. The apertures of the second and third grille are, for example, equal in size but not necessarily in number.

It will be noted that in a variant, the zone of the third series of apertures possesses the same dimensions as zone 19 of the second series of apertures.

According to another variant, the third filtration grille is omitted.

When the electronic boards are used in a damp ambient environment, polluting particles, in particular metal particles contained in the air vein and which are carried along by the forced ventilation system of the airplane, may adhere to the conductive paths of the electronic boards and constitute short-circuits of sorts between the paths of the boards. These short-circuits lead to electrical malfunctions. In order to overcome this phenomenon, some parts manufacturers put down varnish on the electronic boards so that the paths of the board are insulated from shavings possibly projected onto same. However, this involves several design disadvantages. In fact, it is necessary to perform additional varnishing operations during manufacture of the electronic boards, which is going to lead to additional costs. Furthermore, when it is wished to repair a board, it first is necessary to perform a de-varnishing operation in order to access the conductive paths. Finally, certain products used on the electronic boards are incompatible with the insulating varnishes used, for example the layers of silicone-based thermal coupling.

By filtering the largest particles at the bottom part of the electrical equipment, projection of these particles onto the boards thus is limited. To implement such a solution, a dual-baffle concept with three levels of filters is used as follows:
  a very porous lower base 42 (second filtration grille) nonetheless with closings directly facing the ventilation apertures of seat 7 (first filtration grille) of the electrical and mechanical adaptation tray; this first baffle level is intended to retain the largest particles between the bottom of rack 1 and base 42 of electrical equipment 2;
  a slider support 43 (third filtration grille) opposite lower base 42 (second grille) very clearly less porous than seat 7 of the tray so as to generate a pressure drop with apertures 56-58 still offset in relation to apertures 53-55 of lower base 42. This offset may be implemented in two ways:
    either at slider support 43,
    or through local closings on the slider support, which is porous facing the apertures of the inter-slider spaces. This second level of baffles is intended to trap the large particles which might have been able to pass the first barrier of baffles between base 42 and ARINC tray seat 7.

Figure 1A:
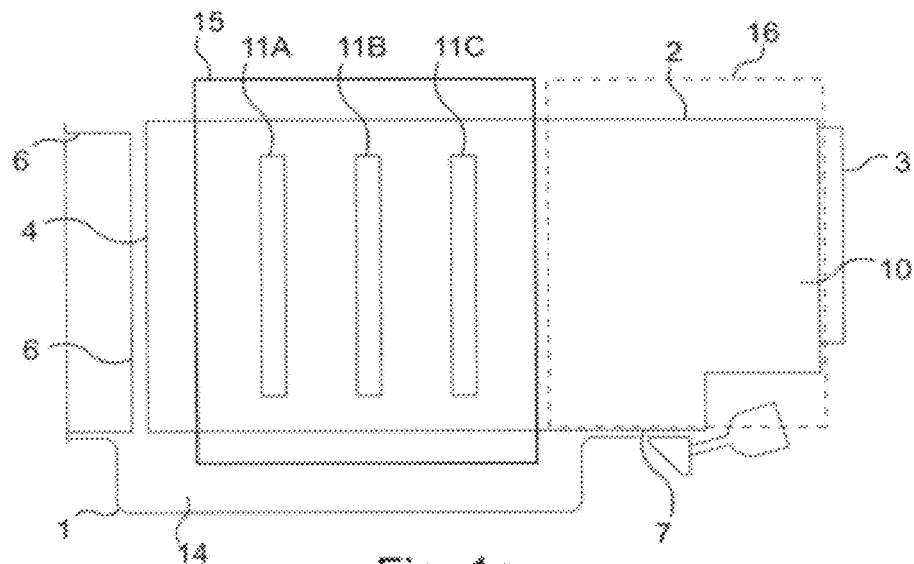
FIGS. 1a and 1b show views of the state of the art described above.
Figure 1B:
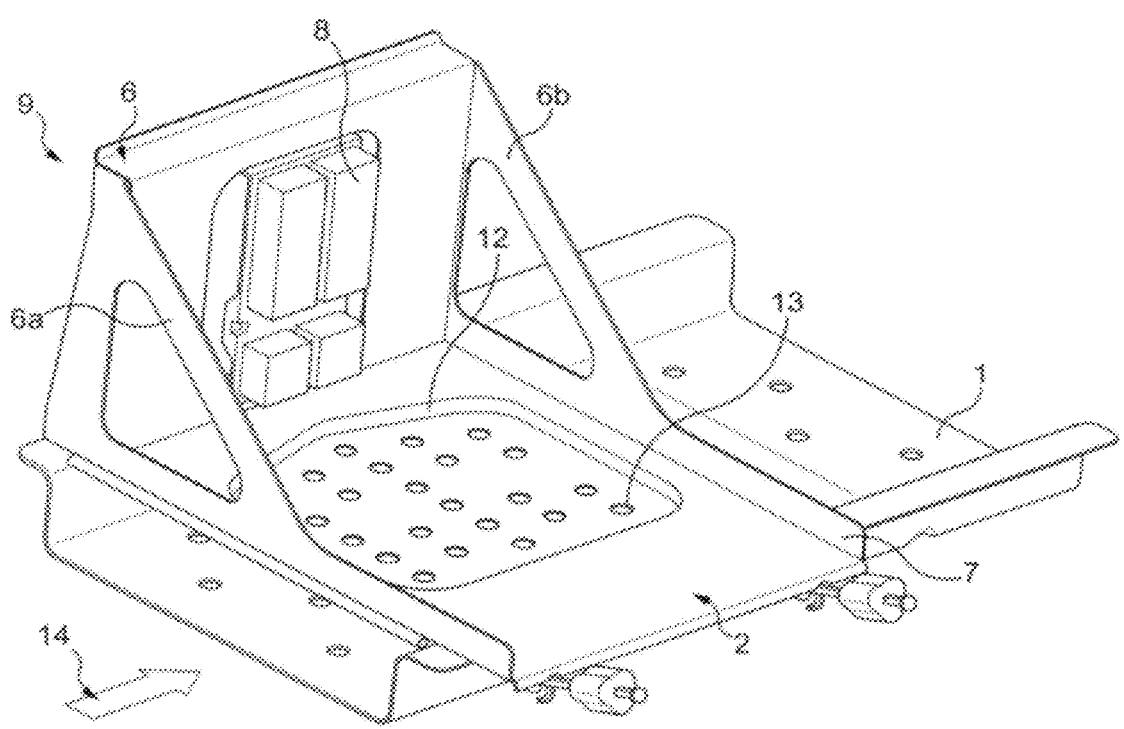
Figure 2:
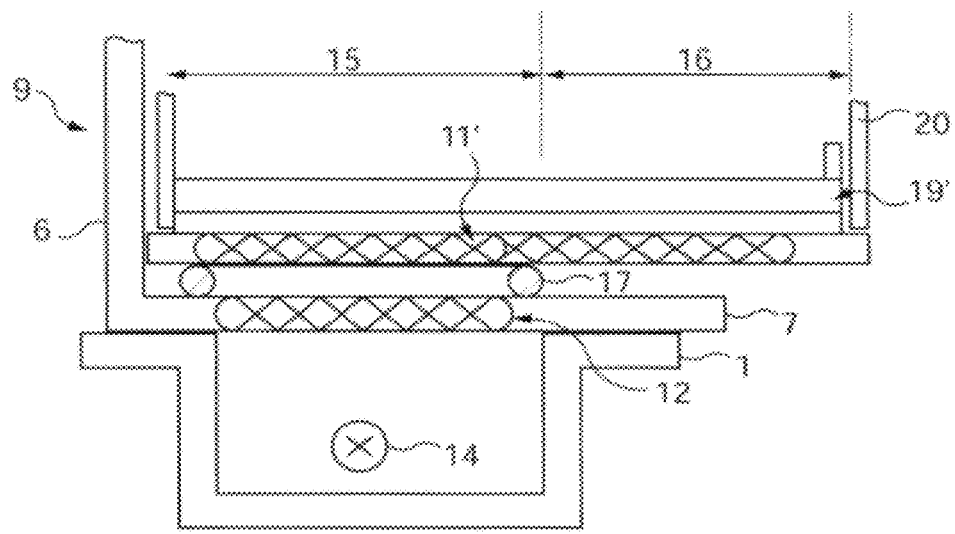
FIG. 2 shows a schematic view of operation of the state of the art already described.
Figure 5:
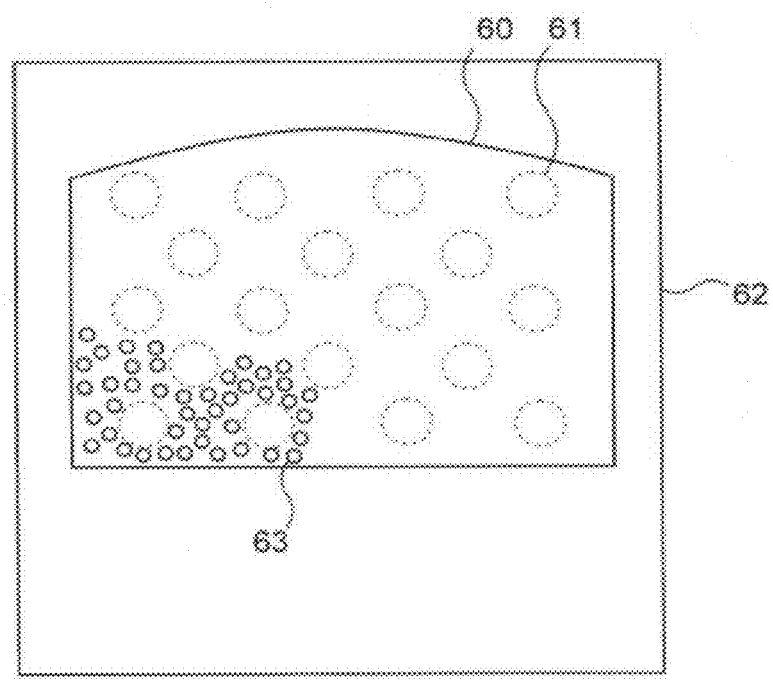
FIG. 5 shows an illustration of a first baffle(s) level in an embodiment of the invention.

On FIG. 5, a diagram of distribution between the different porosities of the two first levels of baffles provided has been shown in a view from above. ARINC tray seat 7 is equipped with a peripheral joint 60 and with apertures 61 distributed over the entirety of first pressure zone 39 visible on FIG. 2. Above this perforated plate or grille, there is disposed the porous base of the equipment comprising a plurality of small apertures 63 which are offset in relation to any aperture 61 of the seat (apertures 61 are seen showing through in order to facilitate understanding). Apertures 63 are arranged between apertures 61 along a projection view on the seat of the tray. Porous base 62 of the equipment has apertures only in the zone surrounded by joint 60 so as to allow a communication exclusively with first pressure chamber 39.

Figures 6, 7:
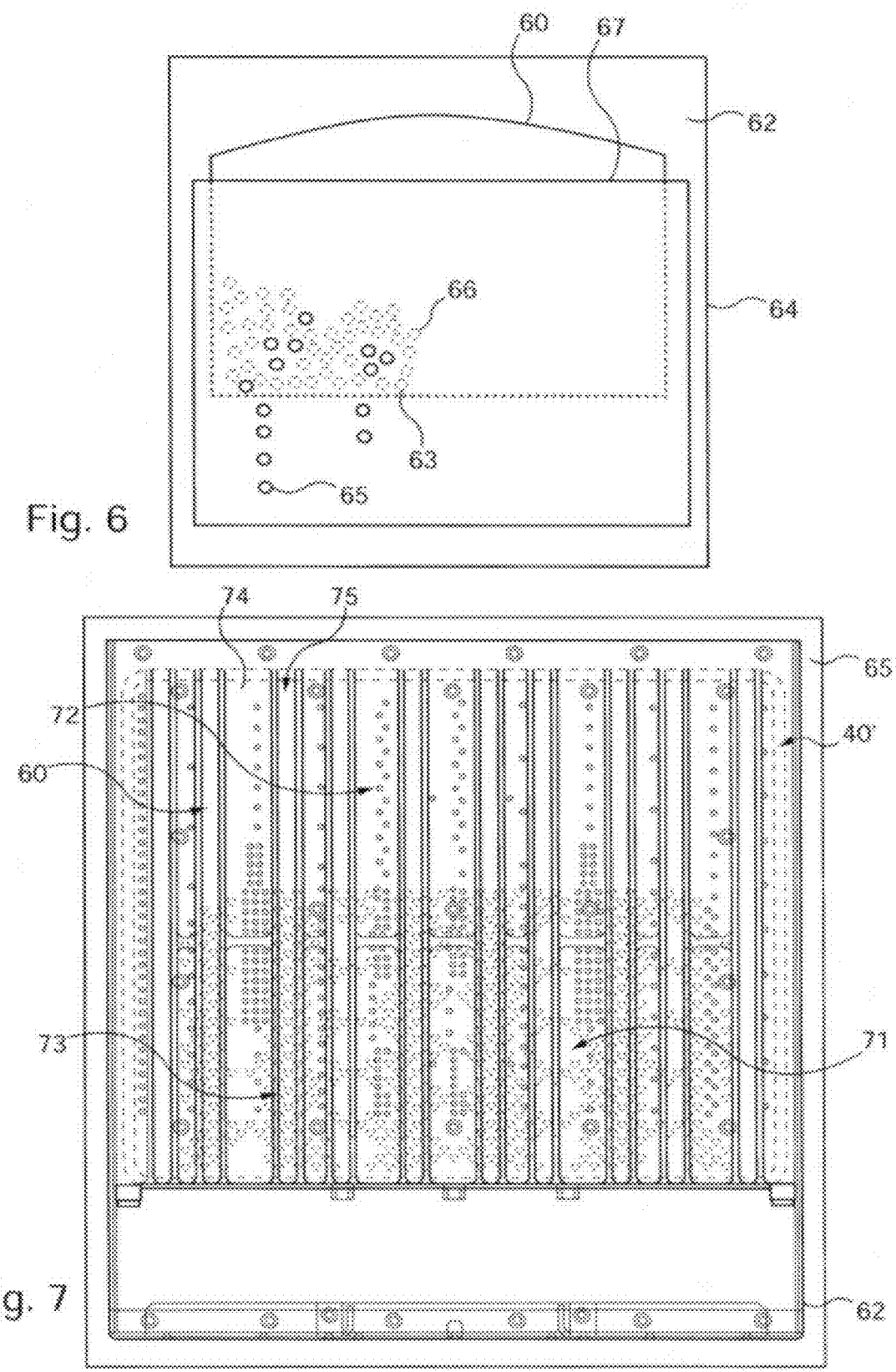
FIG. 6 shows an exemplary embodiment of a second level of baffles in another embodiment of this invention.
FIG. 7 shows an embodiment of the invention in an ARINC 600-type avionic bay.

FIG. 6 illustrates an embodiment of two levels of baffles. Joint 60 and porous base 62 with its apertures 63 have been shown again. Slider support 64 is disposed above the second pressure chamber. Slider support 64 is provided with a series of apertures 65 contained in widened zone 67, and which are disposed above apertures 63 of base 62 of the equipment, but in offset manner. Apertures 65 also extend in a zone that is offset laterally in relation to the zone of the seat delimited by joint 60.

The result of this arrangement is that the air under pressure may pass from first pressure chamber 39 to second pressure chamber 41, thus making it possible to diffuse the air in the interior of the equipment in a zone 67 with larger expanse than delimited zone 60 available by default in the avionic bay.

On FIG. 7, an embodiment of the device of the invention has been shown schematically in a view from above. The seat (delimited zone 60) of the ARINC tray and lower porous base 62 of the equipment that serves to support the sliders for the boards thus are discerned. In this stacking, sliders 75 and perforated inter-slider zones 74 for cooling the electronic boards may be seen. Joint 40' between the base and the slider support is disposed in a maintenance groove of the base. Ventilation apertures 72 are disposed both in the inter-slider zones such as zone 74 and outside ARINC zone 60 but are not arranged facing the apertures of the porous lower base. Reserves of material 71 also have been provided on the porous lower base so that the main apertures of the seat of the ARINC tray do not directly face the apertures of the base of the equipment.

Figure 8:
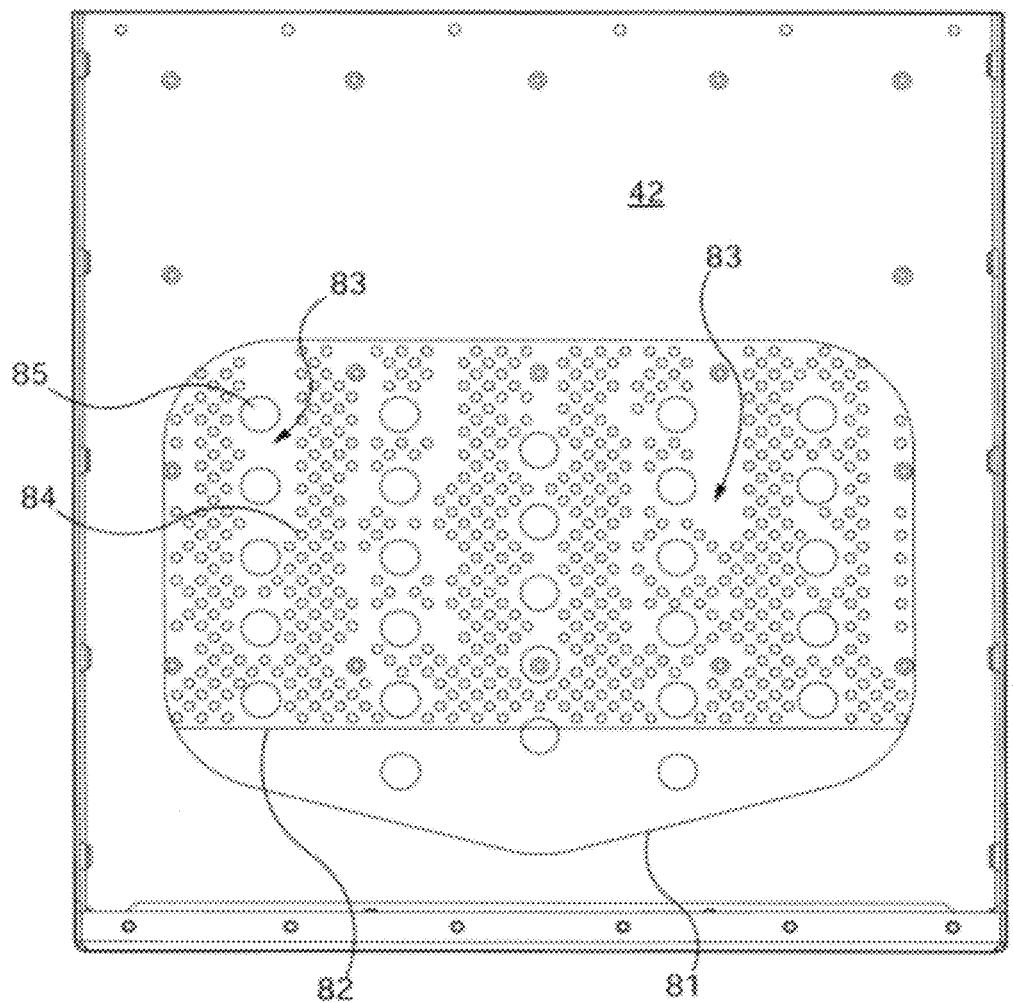
FIG. 8 shows a view from above illustrating the make-up of a part of a device according to an embodiment of this invention.

FIG. 8 is a view from above of the porous lower base which is disposed above the seat of the ARINC tray. This porous lower base 42 comprises an aperture or porosity zone 82 disposed above aperture zone 81 implemented in the seat of the ARINC tray. Aperture zone 82 is delimited by the limitation joint of first pressure chamber 39 so that the apertures of zone 82 allow a controlled fluidic connection between the first and second pressure zones.

Material reserve zones 83 and apertures 84 have been shown on lower base 42. Material reserve zones 83 are situated facing ventilation apertures 85 of the tray seat. These zones 83, however, also may be placed facing the ventilation apertures of the slider-holder plate or slider support 43 (not shown on FIG. 8).

The taking into consideration of the constraints of pressure drop which the electrical equipment imposes results directly in a porosity, or a degree of porosity, determined for each of the three levels of separation of filtration grilles. It will be noted that the low porosity values (small diameters) of the separations or grilles may create high local speeds, potentially generating interference in the pressure-flow operating range. These interferences are uncomfortable for the crew and the passengers on board the aircraft. These acoustic phenomena are intensified when the ventilation system generates:

high-speed air jets in the equipment,
abrupt variations between passage areas between the electronic bay and the equipment access.

It thus is provided to offer a more gradual variation of the separations, between the ARINC tray and the porous lower base on the one hand, and between the porous lower base and the slider support on the other hand, the porosity of which then may be increased. By increasing the porosity for the same flow, air speeds may be reduced.

It will be noted that the obstacles resulting from the dual-baffle concept favorably disturb the flow of the air, thereby attenuating the acoustic phenomena of whistling and/or resonant cavity. By adjusting the various degrees of porosity and the distributions of material reserves at the time of design, it is possible to obtain:

a function of distributor of air over the lower surface of the equipment,
an optimization of forced convection performance during ventilated conditions but also when the ventilation is out of order and one goes over to natural convection;
filtration of the most voluminous impurities by virtue of the concept of three porosity levels.

During ventilated conditions, gains are obtained ranging between:

0 and 10° C. temperature lowering depending on the components and the electronic boards with an average value on the order of 3° C. in ventilated conditions over average temperature rises of 15 to 25° C. This comes down to being able to evacuate an additional dissipated thermal power ranging between 12 and 20% in comparison with the state of the art.
from 0 to 5° C. temperature lowering on cutoff of ventilation, with an average value of 1 to 2° C. depending on the electronic boards and the components;

Over temperature rises of 35 to 40° C., the average gain in dissipated thermal power is 2.5 to 6% and over average temperature rises of 25° C., the average gain in dissipated thermal power is 4 to 8%.

It has been noted following tests that:

on a type-3MCU equipment item, an increase in porosity of 78% on the slider-holder plate with joint (slider support) outside the first pressure chamber is expressed simply by a flow increase between 40 and 45% over the pressure range tested;
on a type-6MCU equipment item, an increase in porosity of 42% on the slider-holder plate with joint outside the zone of the first pressure chamber is expressed simply by a flow increase of 15 to 20% over the pressure range tested.

By determining the degrees of porosity of the three grilles or separations beforehand, a more effective distribution of cooling air may be provided in normal forced convection mode as well as in degraded natural convection mode.

The invention claimed is:

1. A method for distribution of cooling air for heat-dissipating aircraft electrical equipment, the method using a cooling air vein configured to introduce air to cool the heat-dissipating aircraft electrical equipment, the heat-dissipating aircraft electrical equipment to be cooled being disposed above the cooling air vein, the method comprising:

forming a first pressure zone in fluidic communication with the cooling air vein;
forming a second pressure zone in fluidic communication with the first pressure zone, the second pressure zone having an extension dimension extending along an extension dimension greater than an extension dimension of the first pressure zone and being in fluidic communication with an interior of a compartment configured to house the heat-dissipating aircraft electrical equipment to be cooled;
filtering at least one part of the cooling air by passage, along an axial direction, through a first separation grille between the cooling air vein and the first pressure zone;
filtering said at least one part of the cooling air filtered beforehand by passage, along the axial direction, through a second separation grille between the first pressure zone and the second pressure zone; and
filtering said at least one part of the cooling air by passage through a third separation grille, said at least one part of the cooling air being filtered beforehand by passage through the second separation grille,
wherein the first pressure zone is downstream of the cooling air vein, and the second pressure zone is downstream of the first pressure zone and the cooling air vein, and
wherein the third separation grille is arranged upstream of and disposed below a portion of the interior of the compartment configured to house the heat-dissipating aircraft electrical equipment to be cooled.

2. The method according to claim 1, wherein the second pressure zone extends at a lower part of the heat-dissipating aircraft electrical equipment, beneath electronic boards of the heat-dissipating aircraft electrical equipment to be cooled, along the extension dimension, which corresponds at least to a largest dimension of the electronic boards.

3. The method according to claim 1 or 2, wherein the cooling air vein extends along a horizontal direction, cooling air being drawn from the cooling air vein along a vertical direction, and the second pressure zone extending horizontally.

4. The method according to claim 1, wherein said forming the first and second pressure zones is based on determining one or more of a pressure drop between the cooling air vein and the first pressure zone, determining a pressure drop between the first pressure zone and the second pressure zone, and determining a pressure drop between the second pressure zone and the interior of the heat-dissipating aircraft electrical equipment to be cooled, so as to set a distribution of the cooling air.

5. The method according to claim 1, wherein one or more of the second separation grille and the third separation grille includes apertures that are offset transversely in relation to respective apertures of one or more other separation grilles of the first separation grille, the second separation grille and the third separation grille, through which the cooling air passes along the axial direction.

6. An avionic bay comprising:
electrical equipment to be cooled; and
a cooling air vein, disposed underneath the electrical equipment, to provide cooling air;
a first pressure zone in fluidic communication with the cooling air vein to receive the cooling air from the cooling air vein;

a second pressure zone in fluidic communication with an interior of a compartment configured to house the electrical equipment;

a first separation grille disposed between the cooling air vein and the first pressure zone;

a second separation grille disposed between the first pressure zone and the second pressure zone; and a third separation grille disposed between the second pressure zone and a portion of the interior of the compartment configured to house the electrical equipment, wherein the second pressure zone is in fluidic communication with the first pressure zone so as to produce a distribution of cooling air in the portion of the interior of the compartment configured to house the electrical equipment, the second pressure zone extending along an extension dimension greater than an extension dimension of the first pressure zone, wherein the first pressure zone is downstream of the cooling air vein, and the second pressure zone is downstream of the first pressure zone and the cooling air vein, and wherein the third separation grille is arranged below the portion of the interior of the compartment configured to house the electrical equipment to be cooled.

7. The avionic bay according to claim 6, wherein the second pressure zone extends at a lower part of the electrical equipment, beneath one or more electronic boards of the electrical equipment to be cooled, along the extension dimension, which corresponds at least to a largest dimension of the one or more electronic boards.

8. The avionic bay according to claim 6 or 7, wherein the second pressure zone is disposed in contact with a given volume of the electrical equipment to be cooled, which is greater than a volume of the second pressure zone in contact with the first pressure zone.

9. The avionic bay according to claim 6, further comprising:

a rack integrating the cooling air vein, the electrical equipment being disposed on the rack.

10. The avionic bay according to claim 9, wherein one or more of the second separation grille and the third separation grille includes apertures that are set off transversely in relation to respective apertures of one or more of the other grilles through which the cooling air passes along an axial direction.

11. The avionic bay according to claim 6, further comprising an electrical and mechanical adaptation tray, the first separation grille forming a part of the adaptation tray, and the electrical equipment being installed on the adaptation tray, the electrical equipment being able to be installed on the adaptation tray, over a base, of which the second separation grille forms a part.

12. An aircraft comprising at least one said avionic bay according to claim 6.

13. The avionic bay according to claim 6, wherein a first aeraulic joint forms the first pressure zone and a second aeraulic joint forms the second pressure zone.

14. The avionic bay according to claim 6, wherein the avionic bay is configured to have a pressure drop at one or more of an interface between the cooling air vein and the first pressure zone, an interface between the first pressure zone and the second pressure zone, and an interface between the second pressure zone and an interior of the electrical equipment.

15. The method according to claim 1, wherein the first pressure zone defines a first volume and the second pressure zone defines a second volume, the second volume being greater than the first volume.

16. The method according to claim 1, wherein the third separation grille has a length in the extension dimension greater than a length of at least one of the first separation grille and the second separation grille in the extension dimension.

17. The method according to claim 1, wherein the first separation grille is below the second separation grille, and the second separation grille is below the third separation grille.

18. The avionic bay according to claim 6, wherein the third separation grille has a length in the extension dimension greater than a length of at least one of the first separation grille and the second separation grille in the extension dimension.

19. The avionic bay according to claim 6, wherein portions of the first separation grille, the second separation grille, and the third separation grille overlap in an axial direction orthogonal to the extension dimension.

* * * * *